United States Patent
Budach et al.

(10) Patent No.: US 12,135,540 B2
(45) Date of Patent: Nov. 5, 2024

(54) DEVICES AND METHODS FOR EXAMINING AND/OR PROCESSING AN ELEMENT FOR PHOTOLITHOGRAPHY

(71) Applicant: Carl Zeiss SMT GmbH, Oberkochen (DE)

(72) Inventors: Michael Budach, Hanau (DE); Nicole Auth, Ginsheim-Gustavsburg (DE); Christian Rensing, Bensheim (DE); Alexander Freytag, Erfurt (DE); Christian Wojek, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 999 days.

(21) Appl. No.: 17/119,053

(22) Filed: Dec. 11, 2020

(65) Prior Publication Data

US 2021/0132594 A1    May 6, 2021

Related U.S. Application Data

(63) Continuation of application No. PCT/EP2019/065195, filed on Jun. 11, 2019.

(30) Foreign Application Priority Data

Jun. 14, 2018 (DE) .......... 102018209562.0

(51) Int. Cl.
*G05B 19/4155* (2006.01)
*G03F 1/68* (2012.01)
(Continued)

(52) U.S. Cl.
CPC .......... *G05B 19/4155* (2013.01); *G03F 1/68* (2013.01); *G03F 1/72* (2013.01); *G03F 1/74* (2013.01);
(Continued)

(58) Field of Classification Search
CPC ...... G05B 19/4155; G05B 2219/45028; G05B 2219/45031; G03F 1/68; G03F 1/72;
(Continued)

(56) References Cited

U.S. PATENT DOCUMENTS

| 5,315,123 A | 5/1994 | Itoh et al. |
| 5,892,237 A * | 4/1999 | Kawakami .......... H01J 37/3174 250/491.1 |

(Continued)

FOREIGN PATENT DOCUMENTS

| DE | 25 59 209 | 7/1977 | .............. H01J 37/30 |
| DE | 692 13 146 | 2/1997 | ............ H01J 37/304 |

(Continued)

OTHER PUBLICATIONS

Notice of Reasons for Rejection issued by the Koran Patent Office for Application No. KR 10-2021-7001251, dated Jan. 13, 2023 (English Translation).

(Continued)

*Primary Examiner* — David A Vanore
(74) *Attorney, Agent, or Firm* — Fish & Richardson P.C.

(57) ABSTRACT

A device for examining and/or processing an element for photolithography with a beam of charged particles, the device including (a) means for acquiring measurement data while the element for photolithography is exposed to the beam of charged particles; and (b) means for predetermining a drift of the beam of charged particles relative to the element for photolithography with a trained machine learning model and/or a predictive filter. The trained machine learning model and/or the predictive filter use(s) at least the measurement data as input data.

24 Claims, 13 Drawing Sheets

(51) Int. Cl.
*G03F 1/72* (2012.01)
*G03F 1/74* (2012.01)
*G03F 1/86* (2012.01)
*H01J 37/302* (2006.01)
*H01J 37/317* (2006.01)

(52) U.S. Cl.
CPC .............. *G03F 1/86* (2013.01); *H01J 37/302* (2013.01); *H01J 37/317* (2013.01); *H01J 37/3174* (2013.01); *G05B 2219/45028* (2013.01); *G05B 2219/45031* (2013.01)

(58) Field of Classification Search
CPC .. G03F 1/74; G03F 1/86; H01J 37/302; H01J 37/317; H01J 37/3174; H01J 2237/2809; H01J 2237/30455; H01J 2237/2817; H01J 2237/31744
See application file for complete search history.

(56) References Cited

U.S. PATENT DOCUMENTS

| | | | |
|---|---|---|---|
| 10,056,229 B2* | 8/2018 | Bae | H01J 37/3174 |
| 2002/0072003 A1 | 6/2002 | Brill et al. | |
| 2002/0122992 A1 | 9/2002 | Kanamitsu | |
| 2002/0147507 A1 | 10/2002 | Stanton | |
| 2004/0267397 A1 | 12/2004 | Doddi et al. | |
| 2006/0076508 A1 | 4/2006 | Nakasugi et al. | |
| 2009/0014663 A1 | 1/2009 | Nishimura et al. | |
| 2009/0218488 A1 | 9/2009 | Wells | |
| 2012/0273458 A1 | 11/2012 | Bret et al. | |
| 2013/0177855 A1 | 7/2013 | Nakada et al. | |
| 2016/0093466 A1* | 3/2016 | Mizoguchi | H01J 37/28 315/14 |
| 2018/0158552 A1 | 6/2018 | Liu et al. | |
| 2019/0122858 A1* | 4/2019 | Nakayama | G03F 9/7076 |
| 2021/0132594 A1* | 5/2021 | Budach | G03F 1/68 |
| 2023/0113702 A1* | 4/2023 | Rhinow | H01J 37/244 430/5 |
| 2023/0184696 A1* | 6/2023 | Van Leeuwen | G01N 23/04 250/307 |

FOREIGN PATENT DOCUMENTS

| | | | |
|---|---|---|---|
| DE | 601 17 286 | 10/2006 | ............... G03F 7/20 |
| JP | S63-308 317 | 12/1988 | ............. H01L 21/30 |
| JP | 2006-114599 | 4/2006 | |
| JP | 2006330017 A | * 12/2006 | |
| JP | 2010-217918 | 9/2010 | |
| JP | 2014-519046 | 8/2014 | |
| JP | 2016-133936 | 7/2016 | |
| KR | 1020140034799 | 3/2014 | |
| KR | 20180006538 A | * 1/2018 | |
| WO | WO 2017/087653 | 5/2017 | ............... G03F 7/20 |
| WO | WO 2017/117568 | 7/2017 | ............. G06N 99/00 |
| WO | WO 2017/117573 | 7/2017 | ............. G01N 21/95 |
| WO | WO 2017/120253 | 7/2017 | ............... G06T 3/40 |
| WO | WO 2017/123555 | 7/2017 | ............. H01L 21/66 |
| WO | WO 2017/123561 | 7/2017 | ............. H01L 21/66 |
| WO | WO 2017/205537 | 11/2017 | ............. G01N 21/95 |
| WO | WO-2022047235 A1 | * 3/2022 | ........... G05B 19/401 |

OTHER PUBLICATIONS

Notice of Reasons for Rejection issued by the Japanese Patent Office for Application No. JP 2020-569767, dated Dec. 22, 2021 (English Translation).
International Search Report and Written Opinion for International Application No. PCT/EP2019/065195 dated Sep. 10, 2019 (with English Translation).
Cardarelli, G., et al., "Use of Neural Networks in Modeling Relations Between Exposure Energy and Pattern Dimension in Photolithography Process", *IEEE Transactions on Components, Packaging, and Manufacturing Technology—Part C*, vol. 19, No. 4, pp. 290-299 (Oct. 1996).

* cited by examiner

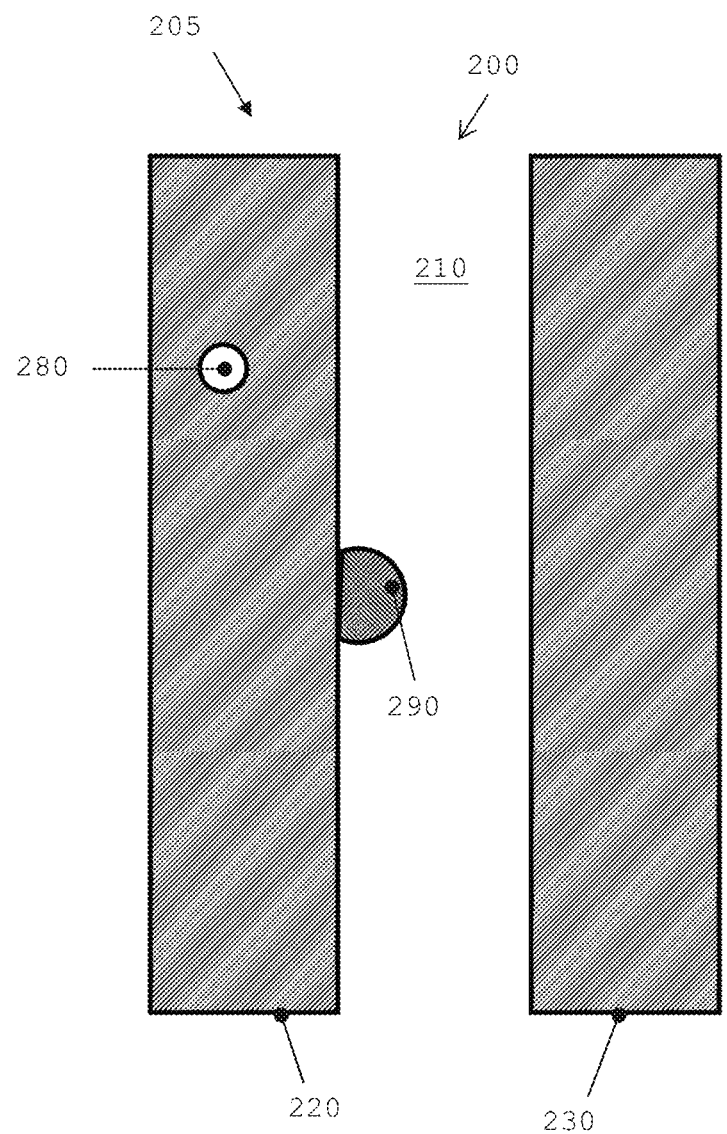

500

550

DEVICES AND METHODS FOR EXAMINING AND/OR PROCESSING AN ELEMENT FOR PHOTOLITHOGRAPHY

CROSS-REFERENCE TO RELATED APPLICATIONS

This application is a continuation of and claims priority under 35 U.S.C. § 120 from PCT Application No. PCT/EP2019/065195, filed on Jun. 11, 2019, which claims priority from German Application No. 10 2018 209 562.0, filed on Jun. 14, 2018. The entire contents of each of these priority applications are incorporated herein by reference.

TECHNICAL FIELD

The present invention relates to devices and methods for examining and/or for processing an element for photolithography with a beam of charged particles. In particular, the present invention relates to devices and methods for predetermining a drift of a beam of charged particles relative to an element for photolithography during a repair of a defect of the element for photolithography.

BACKGROUND

As a consequence of the growing integration density in the semiconductor industry, photolithography masks have to image increasingly smaller structures onto wafers. Producing the small structure dimensions imaged onto the wafer requires photolithographic masks or templates for nanoimprint lithography with ever smaller structures or pattern elements. The production process of photolithographic masks and templates for nanoimprint lithography is therefore becoming increasingly more complex and as a result more time-consuming and ultimately also more expensive. On account of the tiny structure sizes of the pattern elements of photolithographic masks or templates, it is not possible to exclude errors during mask or template production. These must be repaired—whenever possible.

Errors or defects of photolithographic masks, photomasks, exposure masks, or simply masks, are often repaired by one or more process or precursor gases being provided at the repair site and the defect being scanned with an electron beam, for example. Photomasks and templates for nanoimprint lithography are usually electrically insulating samples. Scanning the mask with electrons can therefore cause an electrostatic charging of the mask that deflects the electron beam. Furthermore, as a result of repeated local scanning of the defect region of the mask, the latter may heat up locally, which brings about a change in the length of the photomask and thus a relative displacement of the mask with respect to the scanning electron beam.

Both effects are manifested in the form of distortions and displacements of a scan region or of a writing field of the electron beam, which results in a displacement of the images captured by the electron beam or of the structures written. Moreover, both effects typically result in a distortion of the image field of the scanning electron beam, for example in the form of a change of scale.

The effects of a relative displacement between the mask and the electron beam are often addressed by defining a repair relative to a reference marking in the image or scan region of the electron beam, tracking the position of the reference marking over the repair duration by way of image processing methods, and displacing the electron beam for the repair by use of an offset. The documents cited by way of example below are concerned with applying and detecting the position of reference markings and the displacement thereof over time: DE 2559209 A1, US 2002/0122992 A1, US 2009/0014663 A1, US 2013/0177855 A1 and US 2009/0218488 A1.

In a new approach, attempts are currently being made to tackle a number of challenges in the quality assessment of photomasks with the aid of a machine learning (ML) model. The following documents shall be cited by way of example for this procedure: WO 2017/087653 A1, WO 2017/117568 A1, WO 2017/120253 A1, WO 2017/123555 A1, WO 2017/123561 A1, WO 2017/117573 A1, WO 2017/123555 A1 and WO 2017/205537 A1.

Markings or reference markings degrade in the course of a repair process, but they are subject to conditions similar to those for the defect to be repaired. Therefore, the markings are scanned as infrequently as possible. However, this procedure is at odds with the objective of detecting a displacement between the mask and the particle beam as accurately as possible in order to compensate for it as rapidly and as precisely as possible.

The present invention therefore addresses the problem of specifying devices and methods which improve drift compensation of a charged particle beam and at least partly avoid the disadvantages described above.

SUMMARY

In accordance with one aspect of the present invention, this problem is solved by the device in independent claim 1 and the method in independent claim 18. In a first embodiment, a device for examining and/or processing an element for photolithography with a beam of charged particles comprises: (a) means for acquiring measurement data while the element for photolithography is exposed to the beam of charged particles; and (b) means for predetermining a drift of the beam of charged particles relative to the element for photolithography with a trained machine learning model and/or a predictive filter, wherein the trained machine learning model and/or the predictive filter use(s) at least the measurement data as input data.

Neither an electrostatic charging of the element for photolithography nor a thermal drift of the element for photolithography and/or of a device according to the invention are steady-state processes. A device according to the invention comprises a trained machine learning model (ML model) and/or a predictive filter. On the basis of measurement data, the ML model and/or the predictive filter can predict a drift between the beam of charged particles and the element for photolithography. This enables a continuous compensation of the drift by a device according to the invention. As a result, firstly, it is possible to improve the extent of drift correction or drift compensation vis-à-vis the prior art and, secondly, it is possible to significantly lengthen the intervals in which the drift compensation has to be checked. Furthermore, the uncertainty of a drift compensation can be concomitantly estimated. As a result, the device can be set to carry out very reliable drift measurements frequently or less reliable drift measurements less frequently, depending on the application conditions.

The element for photolithography can comprise at least one marking.

A marking present on the element for photolithography or a reference marking enables a drift of a charged particle beam relative to the element for photolithography to be determined reliably and reproducibly.

The means for acquiring measurement data can comprise: means for scanning the beam of charged particles over the at least one marking and a detector for detecting secondary charged particles and/or charged particles backscattered from the at least one marking.

A device according to the invention can be configured to determine a reference position of the at least one marking before the beginning of the examination and/or the processing of the element for photolithography by scanning the at least one marking.

The reference position of the one or the plurality of markings forms the position in relation to which the changes in the position(s) of the marking(s) in the course of an examination process or a processing process are referenced. The change in the position of a marking can be specified in relative terms, i.e. in relation to the reference position, or in absolute terms, i.e. in relation to a coordinate system of the element for photolithography.

The device can be configured for determining a position change of the at least one marking with respect to the reference position.

After a time interval the means for acquiring measurement data can scan the one or the plurality of markings again in order to determine the displacement of the marking. The new or updated positions of the one or the plurality of markings form updated input data for the ML model and/or the predictive filter. On the basis of the updated input data, the ML model and/or the predictive filter ascertain(s) the drift of the beam of charged particles relative to the element for photolithography for the next time interval.

The device can be configured to determine a measure of certainty with respect to a detection of the at least one marking. The measure of certainty with respect to a detection of the at least one marking can comprise a cross-correlation coefficient for the coordinates of the at least one marking with at least one defect of the element for photolithography or between the coordinates of at least two markings. The measure of certainty indicates the reliability of the measurement values for determining the position of one or more markings. This variable can be taken into consideration in the determination of the time interval of the next acquisition of measurement data for the at least one marking.

The trained machine learning model can be configured to determine a measure of confidence.

The trained machine learning model and/or the predictive filter can be configured to use the measure of confidence as input data.

The measure of confidence indicates the reliability of the prediction of the position of one or more markings for the next time interval. By virtue of this variable being provided to the machine learning model and/or to the predictive filter as input data, the latter can predict a time range in which new measurement data of the at least one marking should be acquired.

The device can be configured to determine a distortion of a scan region of the beam of charged particles from the position displacements of at least two markings.

For determining the distortion of the scan region, it is expedient to use four markings within the scan region of the beam of charged particles and to arrange them such that they enclose the scan region of the beam of charged particles for the most part.

The trained model can use at least one additional parameter of the examination and/or processing as additional input data.

By virtue of the fact that, besides the measurement data of the marking(s), one or more additional parameters are used as input data for the machine learning model and/or the predictive filter, the precision of the predetermination of the drift of the beam of charged particles can be increased.

The at least one additional parameter can comprise: a temperature in the examination and/or processing region, a pressure in the examination and/or processing region, an air humidity in the examination and/or processing region, a type of the element for photolithography, a type of the defect of the element for photolithography, a size of the defect, a location of the defect on the element for photolithography, the location of the defect relative to the at least one marking, at least one precursor gas used for defect correction, a gas mass flow rate of the at least one precursor gas, a time of action of the precursor gas, a time duration of the defect correction, a residence duration of the element for photolithography in the device, one or a plurality of scan operating modes of the beam of charged particles, a residence duration of the beam of charged particles during the examination and/or processing of the element for photolithography, a number of switching processes of the at least one precursor gas during the processing of the element for photolithography, and points in time of the switching processes of the at least one precursor gas during the processing of the element for photolithography.

The trained machine learning model and/or the predictive filter can predetermine continuously over time a displacement of the reference position of the at least one marking.

A major advantage of a device according to the invention is that the ML model and/or the predictive filter can predetermine a drift of the charged particle beam relative to the element for photolithography for any point in time. This enables a device according to the invention to correct the relative drift continuously or in very small time intervals, without having to measure the position of the one or the plurality of markings in equally small time intervals. This makes it possible to prevent the marking(s) from degrading excessively during an examination process and/or a processing process. An effect of the drift on an examination process and/or a processing process can largely be avoided as a result.

The trained machine learning model can output at least one element from the group: a length of a time interval until a renewed acquisition of measurement data, the measure of confidence of a drift correction and a scan region for a next scan of the at least one marking.

Besides a continuous prediction of the position change of the at least one marking, an ML model can output a measure of confidence or a measure of the prediction accuracy or prediction acuity. Furthermore, the ML model can specify the length of the time interval with respect to which, on the basis of a renewed measurement of the one or the plurality of markings, a difference in the position change of the marking as predicted by the model and its measured position change(s) of the marking(s) is intended to be checked. This means that the ML model, in a manner governed by the situation, proposes the point in time for a next checking of the prediction by a measurement. By way of example, the time interval can be determined on the basis of the measure of the prediction accuracy. Furthermore, the ML model can output the scan region of the next scan of the one or the plurality of markings, such that the scanning of the one or the plurality of markings can be optimized.

The trained machine learning model can comprise a recurrent neural network (RNN). The recurrent neural network can comprise a long short-term memory (LSTM) network.

The training data of the machine learning model can comprise position data of the at least one marking. Furthermore, the training data of the machine learning model can comprise position data of the at least one marking and at least one additional parameter of the examination and/or of the processing. Moreover, the training data of the machine learning model can comprise position data of the at least one marking, at least one additional parameter of the examination and/or of the processing and a measure of certainty with respect to the detection of the at least one marking. The training data of the machine learning model can comprise the measure of confidence with respect to the reliability of the prediction of the position(s) of the at least one marking.

The training data of the machine learning model can comprise data, i.e. position data, at least one additional parameter, a measure of confidence and/or a measure of certainty, which were acquired by two or more devices. The training data can be acquired in different time ranges and/or in different set-up environments of the device. Furthermore, the training data can be acquired in different states of the device. Moreover, the training data can be acquired during an examination and/or during a processing process of the element for photolithography.

The predictive filter can comprise an element from the group: a Kalman filter, a particle filter and a low-pass filter with a finite impulse response. The Kalman filter can comprise an extended Kalman filter (EKF) that takes account of nonlinear movements.

The filter can be configured to couple a time duration until the next scanning of the at least one marking with an uncertainty of the predetermination by the predictive filter.

The predictive filter can be configured to discard a measurement of the at least two markings if a measure of certainty with respect to a detection of the marking(s) exceeds a predefined threshold value.

A device according to the invention can comprise a trained machine learning model and a predictive filter.

A trained ML model can be used together with a predictive filter, such as a particle filter, for example, in order to track a plurality of hypotheses with respect to a change in the position of one or more markings with corresponding uncertainties/certainties until the next measurement of the position of the at least one marking. For this purpose, the plurality of hypotheses would be sampled and each would be advanced in accordance with the trained ML model.

The predictive filter and/or the trained machine learning model can be configured to predetermine the displacement of each of the reference positions of the at least two markings and/or of a centroid of the at least two markings.

The trained machine learning model and/or the predictive filter can be configured to predetermine distortion parameters of the scan region of the beam of charged particles.

A device according to the invention can be configured to instigate immediate or delayed scanning of the at least one marking, on the basis of output data of the trained machine learning model and/or of the predictive filter.

If the measure of confidence of the trained ML model and/or the predictive filter indicate(s) an uncertain prediction of the predetermination of the position change of the at least one marking, a measurement of the position of the marking can be instigated in order to eliminate or at least significantly reduce the uncertainty of the predetermination.

The means for acquiring measurement data can comprise: means for determining a time of action of the beam of charged particles on the element for photolithography.

The measurement data can comprise at least one element from the group: an energy of the beam of charged particles and a current intensity of the beam of charged particles.

The time duration of the action of a charged particle, together with the beam intensity thereof and the kinetic energy of the beam of charged particles, determines the electrostatic charging of a photolithographic mask. Furthermore, these parameters have an influence on a local temperature change of the photomask and/or of a device according to the invention.

The means for acquiring measurement data can comprise: means for determining an outflow of charged particles from the element for photolithography. The means for determining the outflow of charged particles from the element for photolithography can comprise a current measuring instrument or an ammeter.

As already explained above, the electrostatic charging of an element for photolithography is not static. As a result of the exposure of the element, further charge is input into the element and at the same time electrical charge flows away from the element. If the element for photolithography comprises a photolithographic mask, a charge outflow can take place by way of the electrical conductivity of individual layers of the mask or via the surface of the mask for example with the support of gases adsorbed on the surface.

The device can furthermore be configured to implement the trained machine learning model and the predictive filter in parallel.

A device according to the invention can furthermore comprise means for depositing the at least one marking on the element for photolithography. The means for depositing the at least one marking can comprise the beam of charged particles and at least one precursor gas in the form of a deposition gas.

Furthermore, a device according to the invention can comprise means for removing the at least one marking from the element for photolithography. The means for removing the at least one marking can comprise the beam of charged particles and at least one precursor gas in the form of an etching gas. Furthermore, the means for removing the at least one marking can comprise a cleaning process, in particular a wet-chemical cleaning process of the element for photolithography.

A device according to the invention can furthermore comprise means for correcting at least one defect of the element for photolithography with the aid of the beam of charged particles and at least one precursor gas. The defect can comprise a defect of missing and/or excess material of the element for photolithography. A defect of missing material can be processed by using the beam of charged particles and a precursor gas in the form of a deposition gas. A defect of excess material can be processed by using the beam of charged particles and a precursor gas in the form of an etching gas.

A precursor gas for depositing a marking on an element for photolithography can comprise at least one element from the group: carbon monoxide (CO), carbon dioxide ($CO_2$), aromatic hydrocarbons, aliphatic hydrocarbons. Furthermore, a precursor gas for depositing a marking on an element for photolithography and/or for depositing missing material of one or more pattern elements of a photolithographic mask can comprise at least one metal carbonyl. A metal carbonyl can comprise at least one element from the group: chromium hexacarbonyl ($Cr(CO)_6$), molybdenum hexacarbonyl (Mo(CO)$_6$), tungsten hexacarbonyl (W(CO)$_6$), dicobalt octacarbonyl (Co$_2$(CO)$_8$), triruthenium dodecacarbonyl (Ru$_3$(CO)$_{12}$), and iron pentacarbonyl (Fe(CO)$_5$).

An etching gas can comprise at least one element from the group: xenon difluoride (XeF$_2$), chlorine (Cl$_2$), oxygen (O$_2$), ozone (O$_3$), water vapor (H$_2$O), hydrogen peroxide (H$_2$O$_2$), dinitrogen monoxide (N$_2$O), nitrogen monoxide (NO), nitrogen dioxide (NO$_2$), nitric acid (HNO$_3$), ammonia (NH$_3$), sulfur hexafluoride (SF$_6$) and nitrosyl chloride (NOCl).

The charged particle beam can comprise at least one element from the group: an electron beam and an ion beam.

The element for photolithography can comprise at least one element from the group: a photolithographic mask, a template for nanoimprint lithography and a wafer.

In a second embodiment, a method for examining and/or processing an element for photolithography with a beam of charged particles comprises the following steps: (a) acquiring measurement data while the element for photolithography is exposed to the beam of charged particles; and (b) predetermining at least one drift of the beam of charged particles relative to the element for photolithography with a trained machine learning model and/or a predictive filter, wherein the trained machine learning model and/or the predictive filter use(s) at least the measurement data as input data.

The method can be designed to be carried out by a device of the first embodiment.

A computer program can comprise instructions which, when executed by a computer system, cause a device according to the first embodiment to carry out the method steps of the method of the second embodiment.

DESCRIPTION OF DRAWINGS

The following detailed description describes currently preferred exemplary embodiments of the invention, with reference being made to the drawings, in which:

FIG. 2A schematically illustrates a plan view of a first exemplary repair situation of a defect of a photolithographic mask;

DETAILED DESCRIPTION

Currently preferred embodiments of the device according to the invention and of the method according to the invention are explained in greater detail below on the basis of examining a photolithographic mask and processing a defect of a photolithographic mask. The device according to the invention and the method according to the invention can be used for examining and/or processing all types of transmissive and reflective photomasks. Furthermore, the device according to the invention and the method according to the invention can also be used for examining and/or for processing templates for nanoimprint lithography and/or wafers. However, the device according to the invention and the method according to the invention are not restricted to examining and/or processing elements for photolithography. Rather, it can be used generally for analyzing and/or processing an electrically nonconductive or only poorly conductive sample with a charged particle beam.

Figure 1:
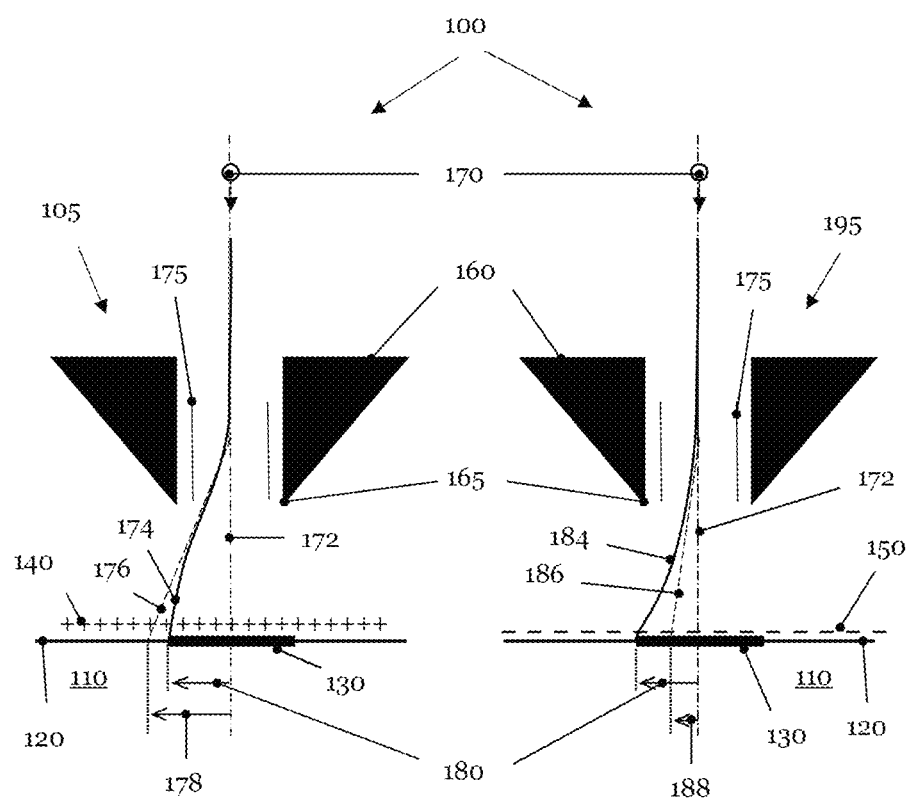
FIG. 1 illustrates one aspect of the problem when examining and/or processing an element for photolithography with an electron beam, the element having a charged surface.

The diagram 100 in FIG. 1 shows a schematic section through a charged sample 110 and an output 165 of a scanning electron microscope 160. The sample 110 can for example be an electrically insulating substrate of a photomask. The sample 110 can be a wafer to be processed or it can be realized by a wafer or a photoresist on a wafer. The sample 110 has on its surface 120 a distribution of surface charges that cause an electrical potential distribution or an electrostatic charging of the sample 110. On the left part of the FIG. 105, the sample surface 120 has positive charges 140. In the right part of the FIG. 195, the sample surface 120 shows an excess of negative charges 150. The reference signs 140 and 150 are used hereinafter to denote both a distribution of surface charges on a sample surface 120 and the electrical potential distributions caused by the charged surfaces.

An electrical charging 140, 150 of a sample surface 120 can be caused by a beam of charged particles 170, for example an electron beam 170 of a scanning electron microscope (SEM) 160. An electrostatic charging 140, 150 of a sample surface 120 can be caused by the scanning of the sample 110 in the context of an examination process or can arise as a result of a processing process. By way of example, an electrostatic charging can be caused during the processing of the sample 110 with an ion beam and/or a processing process of a photoresist arranged on a wafer. Furthermore, an electrostatic charging 140, 150 of a sample 110 can be caused for example by the handling of the sample 110.

In the portion of the sample 110 that is represented in the diagram 100 in FIG. 1, the distribution of the surface charges 140, 150 has a uniform density. However, this does not represent a precondition for the application of the device and method discussed here. Rather, the method and device that are presented in this application can also deal with electrostatic chargings whose electrical potentials vary within small lateral distances.

In the example in FIG. 1, a deflection system 175 deflects the electron beam 170 and scans it over the sample surface 120 in order to determine the dimensions of the structure element 130 of the sample 110. By way of example, a structure element 130 can be a pattern element of an absorber structure of a photolithographic mask. Similarly, a structure element 130 can be an element that a photomask has projected into a photoresist. In another example, the structure element 130 is an element of a chip of a wafer.

As is illustrated in the left part of the FIG. 105 in the diagram 100, as a result of the attractive effect of a positive charging 140 of the sample surface 120, an electron beam 170 scanning the structure element 130 is deflected in the vicinity of the sample surface 120 in the direction of the optical axis 172 and follows the trajectory 174. Without the electrical potential distribution 140, the electron beam 170 would follow the path 176. In an SEM image generated by the electron beam 170, the scanned dimension 178 appears larger than the actual dimension 180 of the structure element 130.

By analogy, the right part of the FIG. 195 in FIG. 1 illustrates the repellent effect of a negatively charged 150 sample surface 120 on the path movement 184 of the electrons 170 of an electron beam 170. As a result of the additional deflection of the electron beam 170, said additional deflection being directed away from the beam axis 172, in the vicinity of the sample surface 120 as a consequence of the electrostatic charging 150, the actual dimension 180 of the structure element 130 in an SEM image generated from the scanning data appears to have a smaller dimension 188 than the actual dimension 180 of the structure element 130.

The scanning of the structure element 130 by use of an electron beam 170 or more generally with the aid of a charged particle beam 170 can result in local heating of the sample 110 and thus in a change in the extent of the sample 110. Even if these changes in length of a sample 110 are only in the nanometers range, nevertheless these changes should be taken into account in a processing process—described below—of a sample 110 in order not to jeopardize the success of the processing process. Moreover, it is possible for thermal effects of the SEM 160 and/or of the sample 110 or the sample mount (not illustrated in FIG. 1) to cause the point of incidence of the electron beam 170 on the sample 110 to drift as a function of time once again in the two-digit nanometers range.

FIG. 2A shows an excerpt 205 of a plan view of a photolithographic mask 200. The photomask 200 comprises a substrate 210. Two pattern elements 220 and 230 in the form of absorbent strips are arranged on the substrate 210 of the mask 200. At the pattern element 220, the mask 200 has a defect 290 in the form of excess material. In order to correct the defect 290, in the first example illustrated in FIG. 2A, a marking 280 is applied to the pattern element 220 in the vicinity of the defect 290 within a scan region of the electron beam 170 of the scanning electron microscope 160. The marking 280 is used to determine and compensate for a drift or a displacement of the electron beam 170 with respect to the defect 290 during a repair process of the defect 290.

On the mask 200 in FIG. 2A, the marking 280 is applied on the pattern element 220. However, it is also possible to apply the marking 280 on the substrate 210 of the photomask 200. Applying the marking 280 on a pattern element 220 or 230 is expedient, however, for photomasks 200 whose pattern elements 220, 230 comprise absorbent material. Markings 280 or residues of markings 280 present on absorbent pattern elements 220 and/or 230 disturb operation of the photomask to a lesser extent than markings applied on the substrate 210.

The marking 280 is deposited after the identification of the defect 290 on the mask 200 for example with the aid of an electron beam induced deposition (EBID) process, i.e., with the provision of at least one precursor gas or process gas on the mask 200. It is advantageous to choose the precursor gas(es) such that the marking 280 has a different material composition than the pattern elements 220, 230 of the mask 200. In the image of an SEM 160, besides a topology contrast the marking 280 additionally stands out by virtue of a material contrast.

Figure 2B:
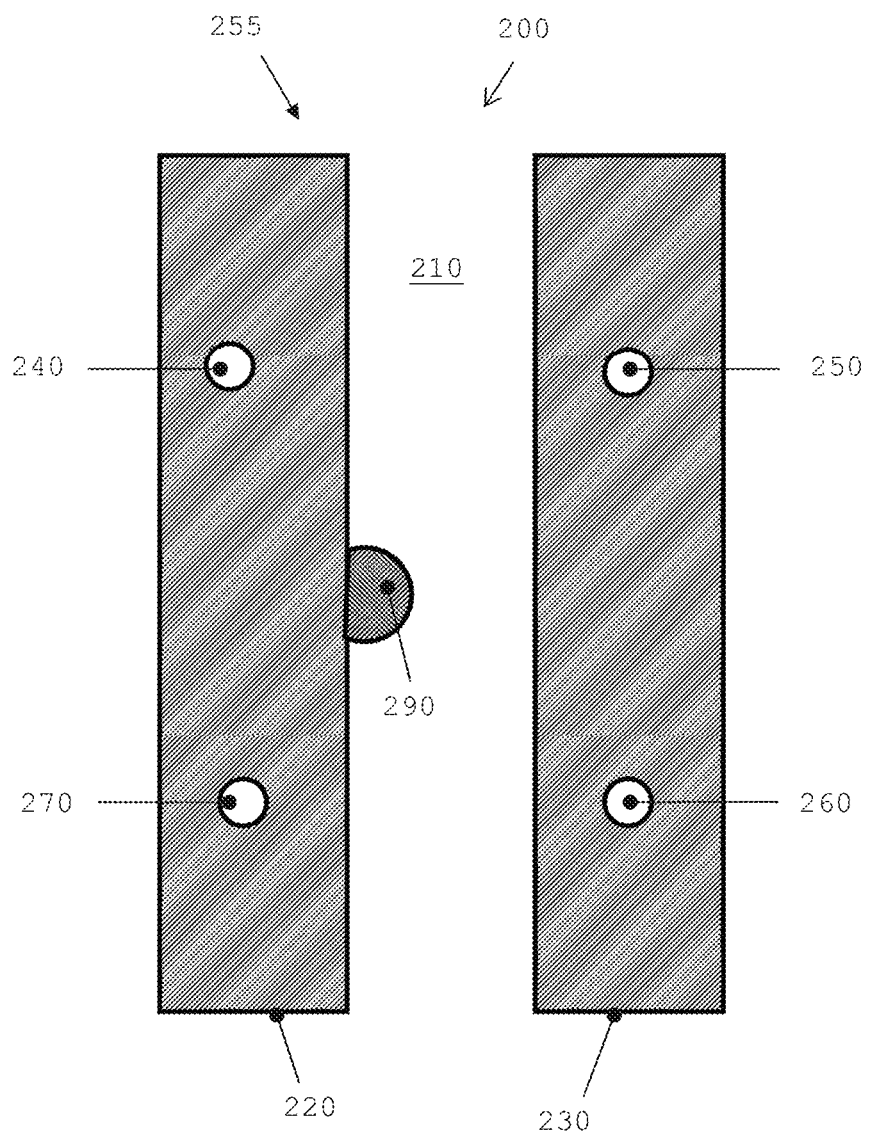
FIG. 2B schematically represents a plan view of a second example of a repair situation of the defect from FIG. 2A.

The diagram 255 of FIG. 2B again shows the excerpt 205 from the photolithographic mask 200 from FIG. 2A with the defect 290. In order to correct the defect 290, in the second example illustrated in FIG. 2B, four markings 240, 250, 260 and 270 are applied on the pattern elements 220 and 230 in the form of a rectangle around the defect 290 within a scan region of the electron beam 170 of the scanning electron microscope 160. The markings 240, 250, 260 and 270 are in turn used to determine and compensate for a drift or a displacement of the electron beam 170 with respect to the defect 290 during a repair process of the defect 290.

On the mask 200, in the example in FIG. 2A one marking 280 is applied and in the example in FIG. 2B four markings 240, 250, 260 and 270 are arranged around the defect 290. For carrying out a method according to the invention, it is not necessary to apply one marking 280 or four markings 240, 250, 260 and 270 on the mask 200. Rather, any desired number of markings can be used for carrying out a method according to the invention.

In an alternative embodiment, it is also possible to apply one or more markings 240, 250, 260, 270, 280 on the pattern elements 220, 230 of the mask 200 by etching one or more depressions into the pattern elements 220, 230 and/or the substrate 210 with the aid of an electron beam induced etching (EBIE) process, i.e. by providing one or more etching gases and an electron beam 170.

The defect 290 of excess material is often removed from the substrate 210 of the photomask 200 by carrying out a local electron beam induced etching process. In order to repair the defect 290, a repair shape is determined for the defect 290, said repair shape describing the scanning of the focused electron beam 170 across the defect 290 during the etching process. The repair shape of a defect 290 takes account of the topology of the defect 290 identified by a metrology tool.

The device according to the invention and respectively the method according to the invention are not restricted to correcting defects 290 of excess material. Rather, they can also be used for correcting defects of missing material of one or more pattern elements 220, 230 and/or defects of missing material of the substrate 210 of the photomask 200 (not shown in FIGS. 2A and 2B).

Figure 3:
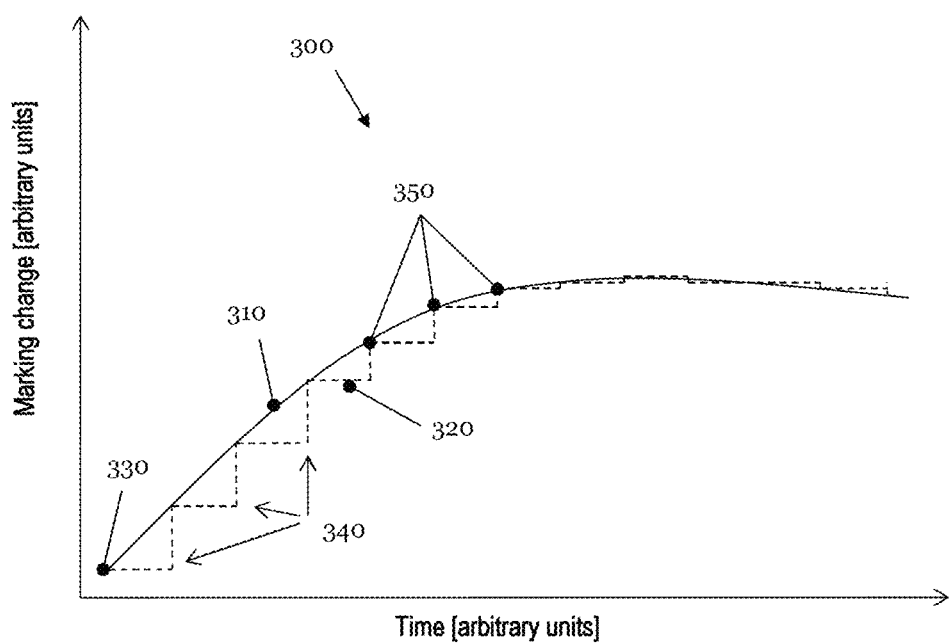
FIG. 3 schematically presents compensation of a drift—caused by an electrostatic charging—of an electron beam with respect to a marking according to the prior art.

FIG. 3 schematically presents the compensation of a drift or a displacement of an electron beam 170 relative to a marking 240, 250, 260, 270, 280 during a repair process of the defect 290 according to the prior art. A local electrostatic charging of a sample 110, for example of the photolithographic mask 200, is difficult to define mathematically. This also applies to a thermal drift between the electron beam 170 and a marking 240, 250, 260, 270, 280. The effects of an electrostatic charging of a sample 110 and/or the displacement thereof relative to the point of incidence of the electron beam 170 are therefore detected and corrected with respect to the marking(s) 240, 250, 260, 270, 280 at periodic time intervals. The solid curve 310 in FIG. 3 schematically shows the change, displacement, variation or drift of a marking 240, 250, 260, 270, 280 as a function of time during a repair process of the defect 290.

At the beginning of the repair process, a reference position 330 of the marking 240, 250, 260, 270, 280 is ascertained. The reference position 330 can be specified relative to a reference marking of the mask 200 or in absolute terms with respect to a coordinate system of the sample 110 or the mask 200. The second step involves defining the position of the repair shape with respect to the marking(s) 240, 250, 260, 270, 280. The repair of the defect 290 is then begun. For this purpose, at the site of the defect 290 in FIGS. 2A and 2B, one or more etching gases are provided and the electron beam 170 is scanned over the defect 290, as predefined by the repair shape.

The repair process is interrupted at regular or irregular time intervals 340, but without the provision of the precursor gas(es) being interrupted, in order to scan the marking(s) 240, 250, 260, 270, 280 with the electron beam 170. A displacement 350, drift 350 or change 350 of the marking(s) 240, 250, 260, 270 with respect to the reference marking 330 or relative to the preceding measurement of the marking(s) 240, 250, 260, 270, 280 is determined from the SEM image of the marking(s) 240, 250, 260, 270, 280. Afterward, the position of the repair shape in relative or absolute terms with respect to the marking(s) 240, 250, 260, 270, 280 is corrected on the basis of the change(s) in the markings and the repair process of the defect 290 is continued.

Figure 4:
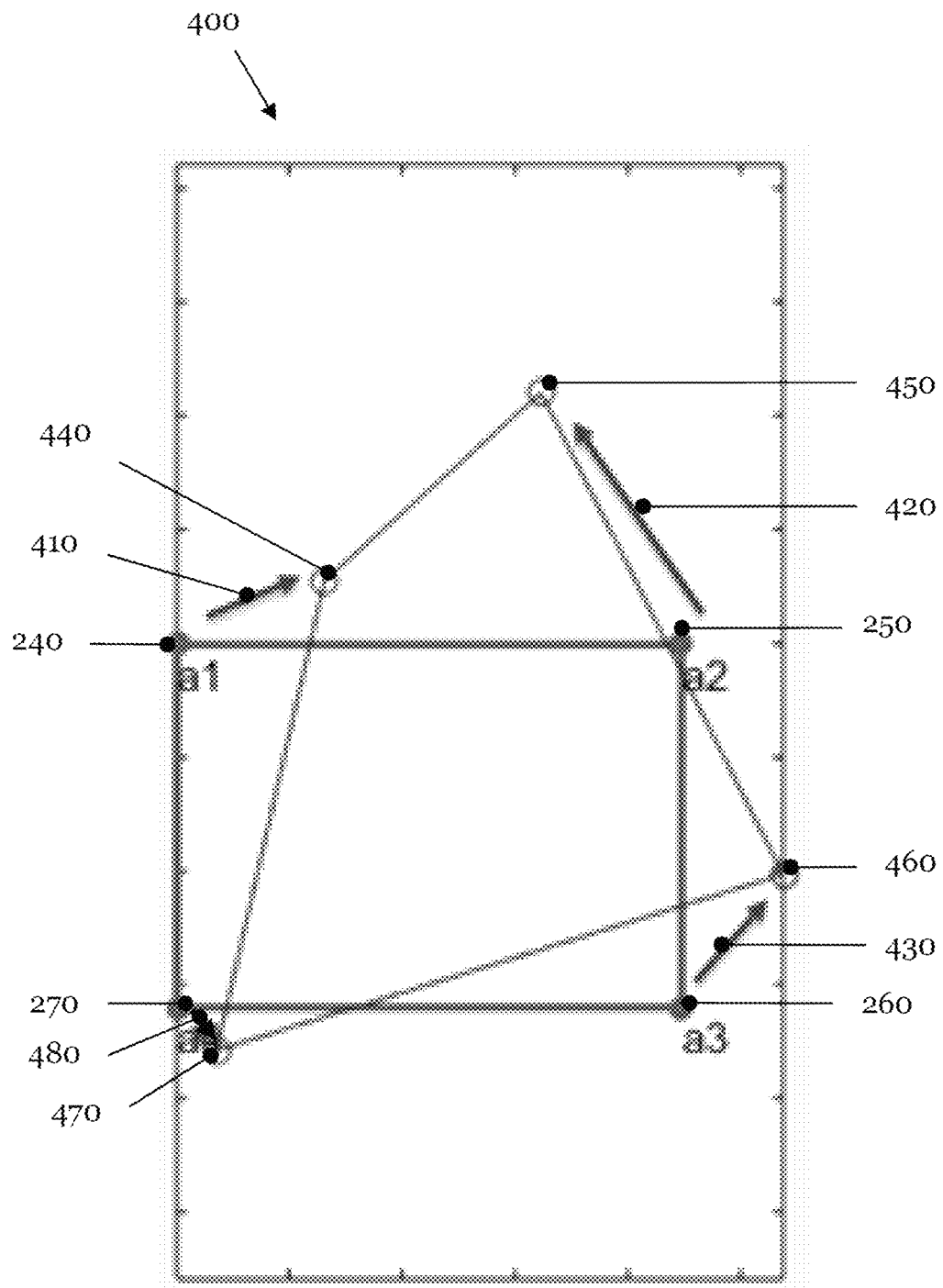
FIG. 4 illustrates measured displacements of the markings from FIG. 2B in the course of a defect repair process.

FIG. 4 presents the displacement of the four markings 240, 250, 260, 270 in the course of the repair process of the defect 290. The displacement or drift can represent one of the measurements 350 in FIG. 3. The marking 240 is displaced by the displacement 410 from the reference position 330 by an electrostatic charging and/or by a thermal drift to the new position 440. The marking 250 drifts, represented by the arrow 420, from the reference position 330 to its new position 450. As illustrated by the arrow 430, the marking 260 changes its original position 330 to a new position 460. Finally, the marking 270 experiences the displacement 480 or drift 480 and is found at the new position 470. The displacements 410, 420, 430 and 480 or the drift 410, 420, 430, 480 are two-dimensional vectors on the surface 120 of the sample 110 or the photomask 200.

In the example illustrated in FIG. 4, the displacement 410, 420, 430, 480 is not identical for all of the markings 240, 250, 260, 270. As a result, the original rectangle of the markings 240, 250, 260, 270 at the time of the reference position 330 changes into a quadrilateral having the vertices 440, 450, 460 and 470. This means that for the best possible compensation of the drift 410, 420, 430, 480 of the electron beam 170, the original repair shape for correcting the defect 290 should be adapted to the different drift 410, 420, 430, 480 of the markings 240, 250, 260, 270.

Figure 5:
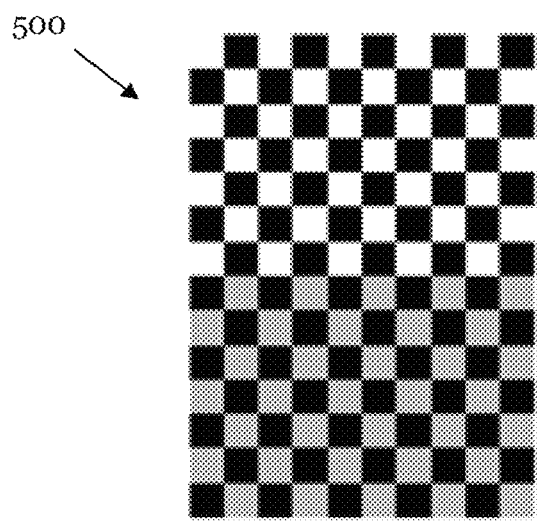
FIG. 5 represents in the upper part of the figure a non-distorted repair shape for the defect from FIG. 2B and presents in the lower part of the figure a repair shape distorted by a drift of the electron beam for compensating for the defect from FIG. 2B.
Figure 5:
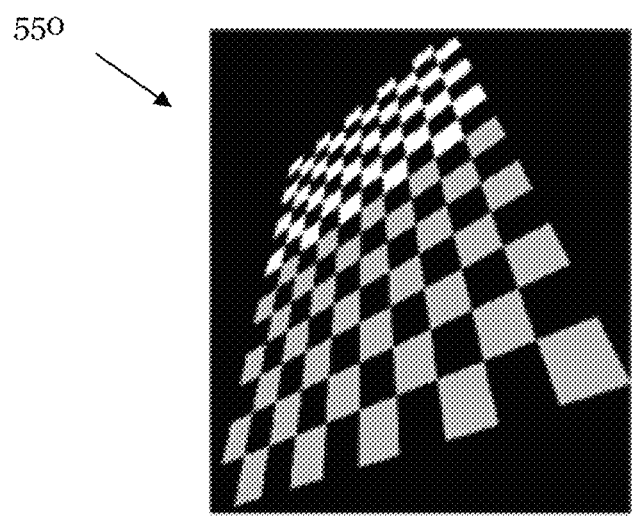

FIG. 5 shows in the upper part of the figure an exemplary repair shape 500 at the point in time of determining the reference marking 330, i.e. at the beginning of the repair process of the defect 290. The lower part of the figure in FIG. 5 presents a distorted repair shape 550, which was ascertained on the basis of the markings 240, 250, 260, 270 distorted from the rectangle to the quadrilateral, as illustrated in FIG. 4. The distorted repair shape 550 is better suited to the further repair of the defect 290 than the original repair shape 500.

However, it is also possible that in FIG. 4 the markings 240, 250, 260, 270 experience substantially only one displacement with respect to the reference position 330, such that the repair shape 500 ascertained originally can be used during the entire repair process of the defect 290.

Figure 6:
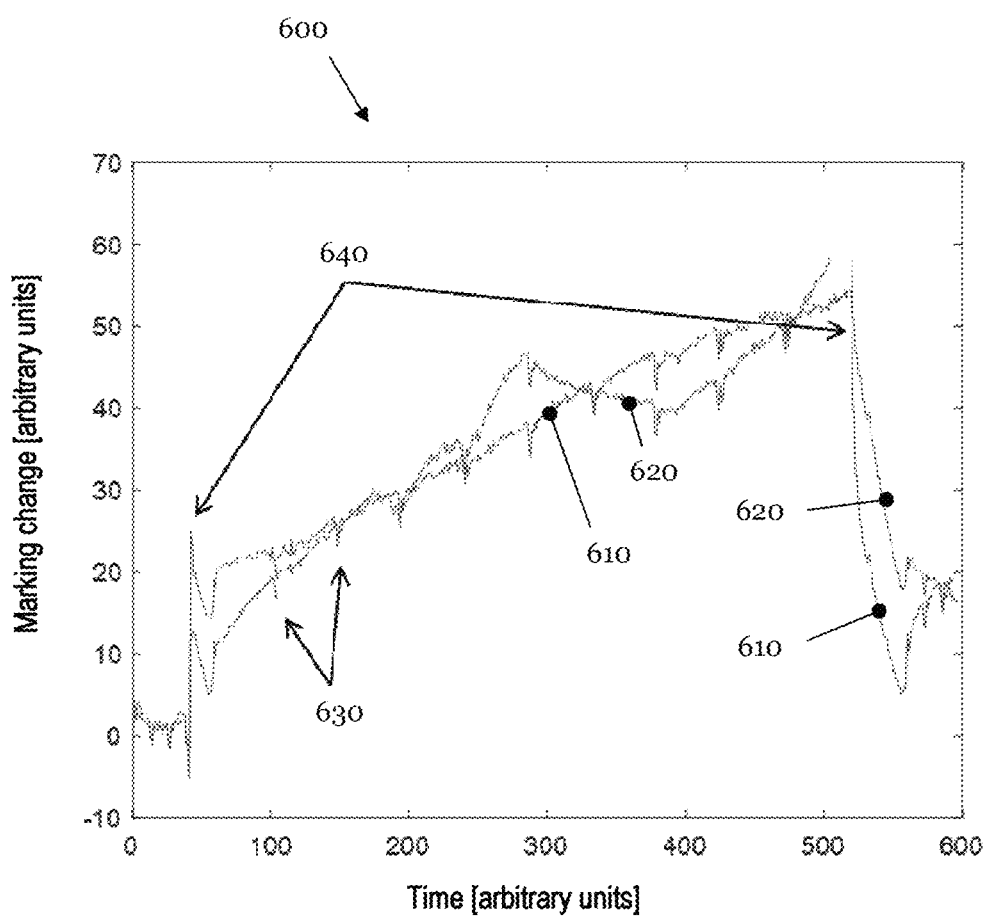
FIG. 6 represents displacements of a marking with respect to an x-axis and a y-axis during a repair of the defect from FIGS. 2A and 2B.

FIG. 6 represents one example of a displacement or a drift of a marking 240, 250, 260, 270, 280 during a repair process of a defect 290. Time in arbitrary units is plotted on the x-axis of the diagram 600 in FIG. 6. The number of measurements of the marking 240, 250, 260, 270, 280 during a repair process can also be represented on the abscissa of the diagram 600. The time interval between carrying out two scan processes can be in the range of 1 second to 50 seconds. The example illustrated in FIG. 6 indicates a time range of approximately 1000 seconds. The total displacement or drift of the marking 240, 250, 260, 270, 280 in arbitrary units relative to the reference position 330 of the marking 240, 250, 260, 270, 280 is represented on the y-axis of the diagram 600. By way of example, the drift can be specified as the number of scanned pixels of the electron beam 170 in one direction. Depending on the focusing of the electron beam, a pixel can have dimensions in the range of 0.1 nm to 10 nm. The ordinate of the diagram 600 encompasses a position change of approximately 120 nm.

The drift 610 of the marking 240, 250, 260, 270, 280 in the x-direction is represented by the curve 610 in the diagram 600 and the displacement 620 of the marking 240, 250, 260, 270, 280 in the y-direction is represented by the curve 620. Large position changes 610, 620 or position displacements 610, 620 of the marking 240, 250, 260, 270, 280 are brought about by switching between two process or precursor gases. This is illustrated by the arrows 640 in FIG. 6. Smaller excursions of the position change 610, 620 arise as a result of the switching between different repair shapes 500, 550 for repairing the defect 290.

In order to compensate for the drift 410, 420, 430, 480, 610, 620 of a marking 240, 250, 260, 270, 280 during an examination process and/or a processing process, for example the correction of the defect 290, the device and the method described in this application use a machine learning model or a predictive filter. A machine learning model can comprise an artificial neural network (ANN). An ANN can be embodied in the form of a recurrent network (RNN), which is especially suitable for the processing of time series data. RNNs have an internal state, a kind of memory which encodes the previous time series history. Besides the input of a time-dependent input signal, an RNN can additionally access the status of the internal state of the preceding point in time in order to produce the output associated with the current or present point in time and to update its own state or an internal state. As a result of this feedback, an RNN can learn a dynamic behavior of signals.

One possibility for realizing an RNN is the use of LSTMs (Long Short-Term Memory), which can be used for changing the internal state when new input signals are present. An LSTM unit comprises a cell, an input gate, an output gate and a forget gate. The LSTM gates calculate an activation often using a logistical function. The input gate controls the extent to which new values enter the cell. The output gate determines the extent to which the value in the cell is used for calculating the output activation of the LSTM unit, and the forget gate determines the extent to which the value remains in the cell. The model can thus learn to remember relevant information even over long periods of time, in order to be able to model dependencies extending over long periods of time.

At least the last measurement 350 of the displacement 410, 420, 430, 480, 610, 620 of the marking 240, 250, 260, 270 and 280 is provided as input data to a trained machine learning model. Preferably, the history of all measurements starting from the determination of the reference position 330 is made available as input data to the trained machine learning model.

In addition, a measure of certainty with respect to the detection of the position 440, 450, 460, 470 of the marking 240, 250, 260, 270, 280 can be provided to the trained machine learning model. The measure of certainty can comprise the covariance of ascertaining the positions 440, 450, 460, 470 of the markings 240, 250, 260, 270, 280. The covariance can be expressed for example in the form of a cross-correlation coefficient between a marking 240, 250, 260, 270, 280 and the defect 290 and/or between two markings 240, 250, 260, 270.

Furthermore, a measure of confidence can be made available as input data to the trained machine learning model and/or the predictive filter. The trained machine learning model and/or the predictive filter can use the measure of confidence to predict a time range when new measurement data of the marking(s) 240, 250, 260, 270, 280 should be acquired.

Furthermore, for the prediction accuracy of a machine learning model it is advantageous to make available to the model as input data one or more parameters characterizing the environment of the analysis site and/or the processing site of the beam 170 of charged particles. Parameters characterizing the environment of the analysis site and/or the processing site can comprise: a temperature, a pressure, an air humidity, a kinetic energy of the beam of charged particles, for instance of the electron beam 170, a current intensity of the beam of charged particles, an exposure setting of the scanning particle microscope, for example of the SEM 160, a type of the element for photolithography, for example the type of a photolithographic mask, a type of the defect of the element for photolithography, for example the defect 290 of the mask 200, a size of the defect, a location of the defect on the element for photolithography, for example the location of the defect 290 in relation to the pattern elements 220 and 230, at least one precursor gas used for defect correction, a gas mass flow rate of the at least one precursor gas, a time of action of the at least one precursor gas, and a time duration of the defect correction. Further possible parameters are a residence duration of the mask 200 in a repair device, one or more scan operating modes of the electron beam 170 of an examination and/or processing device, a residence duration of the electron beam 170 during the examination and/or processing of the defect 290 of the photomask 200, a number of switching processes of one or more precursor gases during a repair of the defect 290, and the points in time of the switching processes of the precursor gas(es) during the repair of the defect 290.

Figure 7:
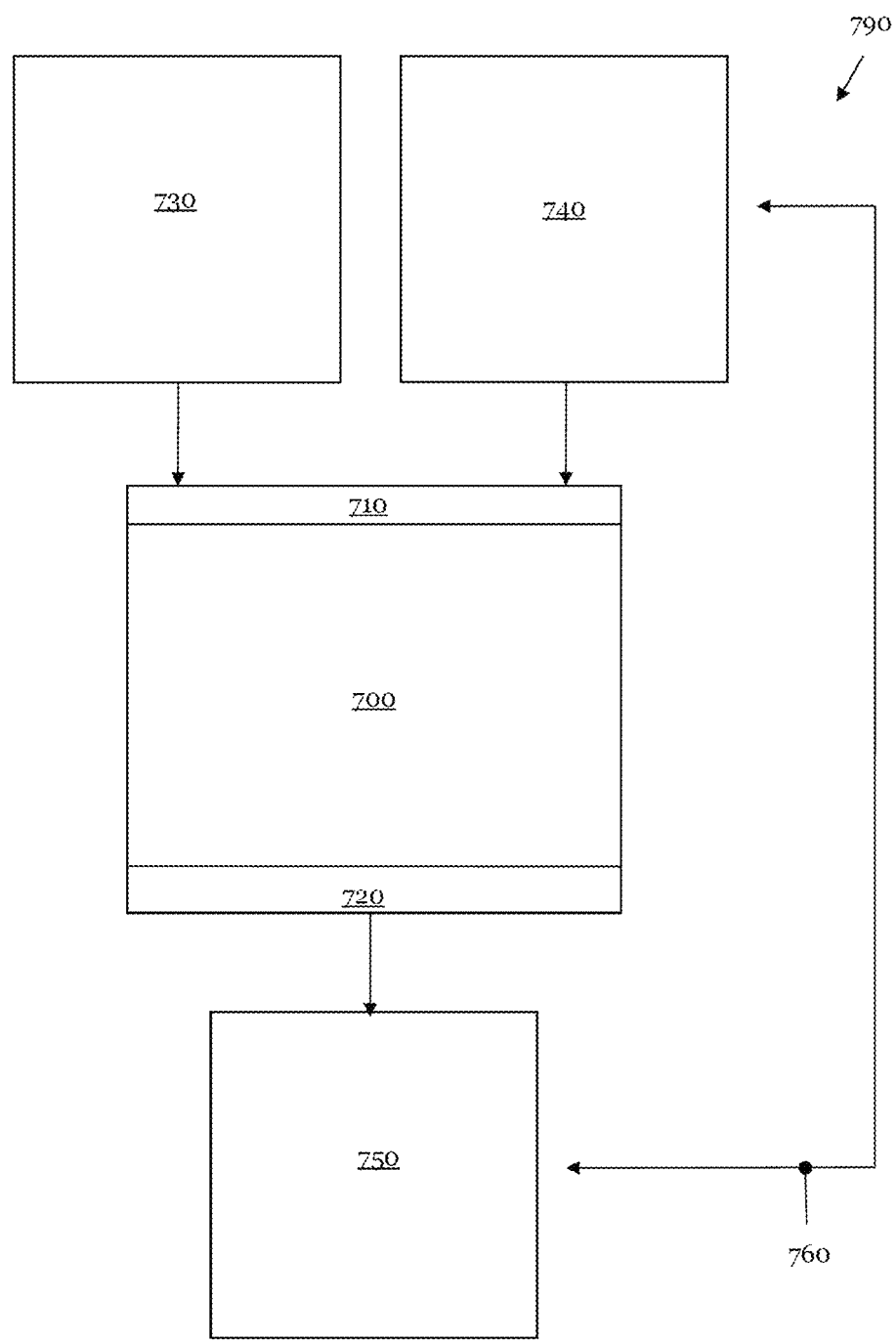
FIG. 7 schematically illustrates a training process of a machine learning model.

Before a generic machine learning model can be used for predicting the displacement 410, 420, 430, 480, 610, 620 dx(t) and dy(t) of a marking 240, 250, 260, 270, 280, the model has to be trained for its task on the basis of an extensive data set or training data set. FIG. 7 schematically illustrates the process of training a generic machine learning model. The diagram 790 in FIG. 7 presents a machine learning model 700 having an input layer 710 and an output layer 720. The machine learning model 700 arises from a generic ML model by adapting the model-internal structure to the problem to be solved, namely the prediction of a drift 410, 420, 430, 480, 610, 620 of a marking 240, 250, 260, 270, 280 with respect to a reference position 330.

In order to generate the training data, long measurement series of identical type are implemented with the SEM 160. In this case, the position data 440, 450, 460, 470 of the last measurement of the marking 240, 250, 260, 270, 280 are made available as a first half of the training data to the machine learning model 700. That is symbolized by the block 730 in FIG. 7. As a second part of the training data set, the displacement and/or the distortion of the repair shape 500, 550, which was determined from the drift 410, 420, 430, 480 of the marking 240, 250, 260, 270, 280, is provided to the machine learning model 700 via the input layer 710. The training machine learning model 700 outputs at its output layer 720 a prediction for the displacement and/or for the distortion of the repair shape 500, 550. The calculated displacement 740 and/or distortion 740 of the repair shape 500, 550 are/is then compared with the predicted displacement 750 and/or distortion 750. It is illustrated by the double-headed arrow 760 in FIG. 7. The model parameters of the machine learning model 700 are varied in order to minimize the difference between the calculated displacement 740 and the predicted displacement 750 and/or the calculated distortion 740 and the distortion 750 predicted by the model 700 for the repair shape 500, 550.

Figure 8:
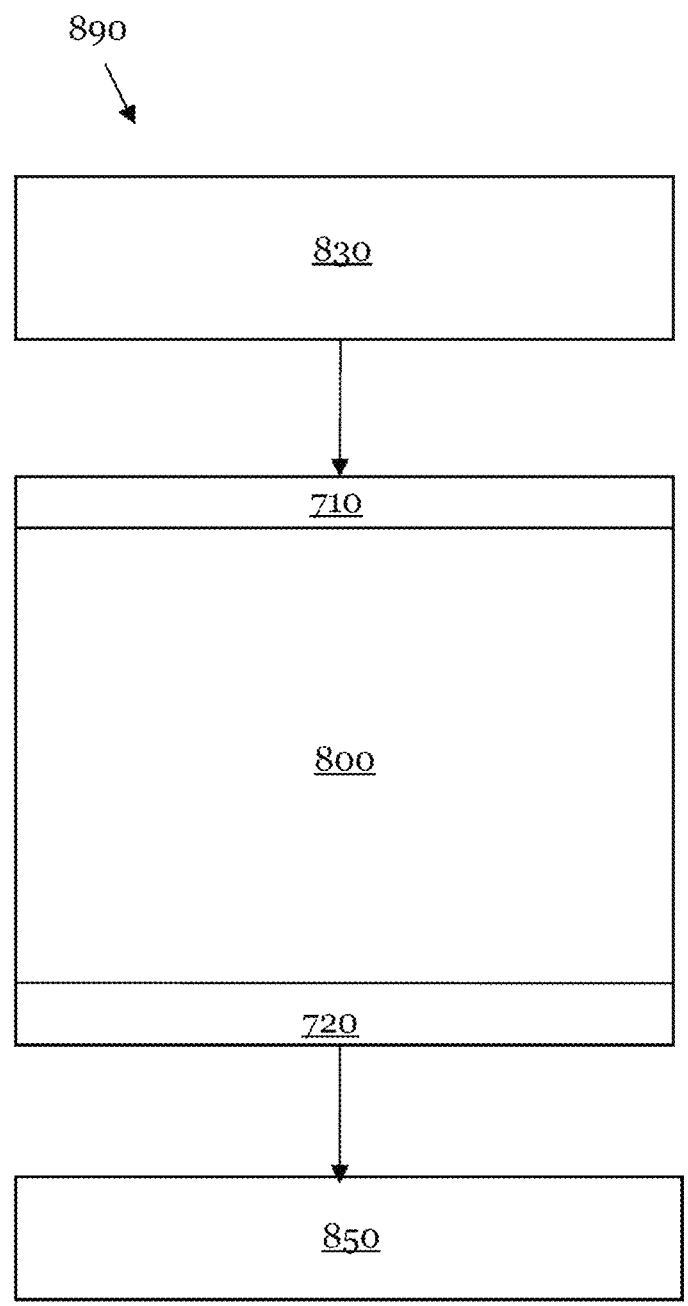
FIG. 8 schematically illustrates the implementation of a trained machine learning model for predetermining a drift of the electron beam during the correction process of the defect from FIGS. 2A and 2B.

The diagram 890 in FIG. 8 schematically shows a trained machine learning model 800 which can be used for predetermining a drift and/or a distortion of a repair shape 500, 550 during a processing process of a defect 290 of a photolithographic mask 200. Via the input layer 710 the trained machine learning model 800 receives input data in the form of at least the last measurement of the position 440, 450, 460, 470 of the marking 240, 250, 260, 270, 280. In addition, the additional parameters described above can be provided as input data to the model. The trained machine learning model 800 determines from the input data 830, as output data 850, a drift of the beam 160 of charged particles or a displacement and/or a distortion of the repair shape 500, 550 for the defect 290 of the photolithographic mask 200.

Figure 9:
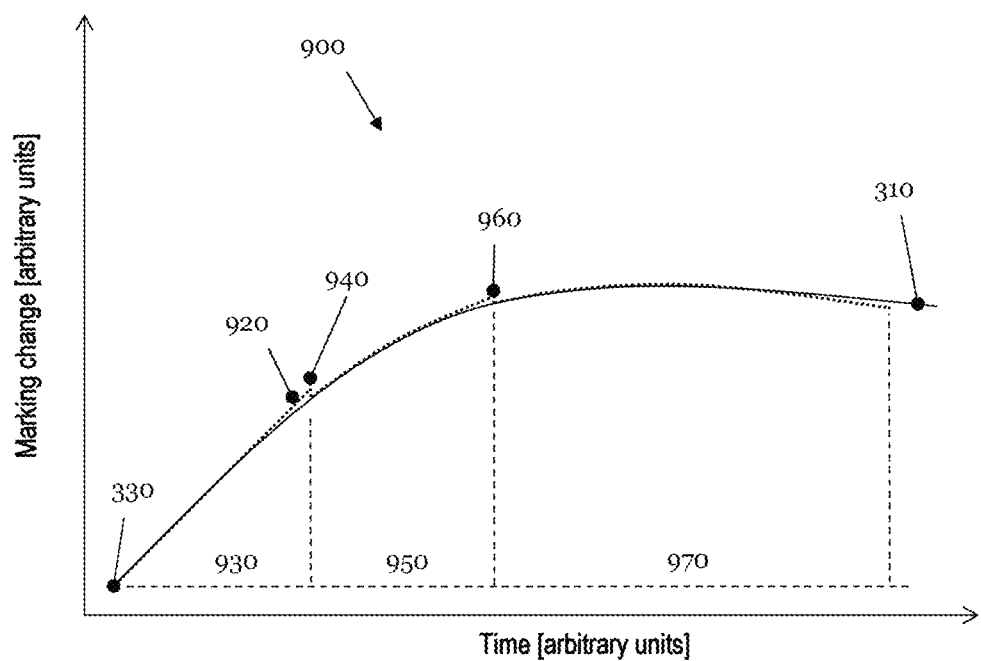
FIG. 9 schematically shows compensation of a drift—caused by an electrostatic charging—of an electron beam with respect to a marking with the aid of a device according to the invention.

FIG. 9 schematically presents the compensation of a drift 410, 420, 430, 480 or a displacement 410, 420, 430, 480 of an electron beam 170 or the displacement and/or a distortion of a repair shape 500, 550 relative to a marking 240, 250, 260, 270, 280 during a repair process of the defect 290 of the photomask 200 in the case of the use of a device according to the invention. The solid line 310 of the diagram 900 reproduces the curve 310 from FIG. 3. The latter describes the effects of a local electrostatic charging of the photolithographic mask 200.

A device according to the invention includes a trained machine learning model, for example the trained machine learning model 800. The prediction of the drift 410, 420, 430, 480 of the marking is represented by the dotted curve 920 in FIG. 9. As explained in the context of FIG. 3, the reference position 330 of the marking 240, 250, 260, 270, 280 is determined before the beginning of the repair of the defect 290. As can be gathered from the diagram 900, the trained machine learning model 800 almost perfectly predicts the variation 410, 420, 430, 480 of the marking 240, 250, 260, 270, 280 over a relatively long time range 930 of the repair of the defect 290 of the mask 200. Moreover, the deviation of the measured drift 310 and the predetermined drift 920 in the case of the second measurement 940 of the marking 240, 250, 260, 270, 280 is very much smaller than in FIG. 3.

On the basis of the data of the second measurement 940 of the marking 240, 250, 260, 270, 280 as input data 830, the trained machine learning model 800 can predetermine the profile of the displacement or drift 410, 420, 430, 480 once again over a relatively long time range 950 of the repair process. In the case of the third measurement 960 of the marking 240, 250, 260, 270, 280, the deviation between the actual drift 310 and the predicted drift 410, 420, 430, 480 is once again small. After the input of the updated position 440, 450, 460, 470 of the marking 240, 250, 260, 270, 280 as input data 830 into the trained model 800 the latter can predetermine the drift 410, 420, 430, 480 of the marking 240, 250, 260, 270, 280 with great accuracy over a long time range 970.

Besides a prediction of a drift or displacement 410, 420, 430, 480 dx(t) and dy(t) for the marking 240, 250, 260, 270, 280 for the next processing interval 930, 950, 970, the trained machine learning model 800 can be trained to predict a length of the interval 930, 950, 970 until the next measurement of the marking 240, 250, 260, 270, 280. Furthermore, the trained machine learning model 800 can be designed to recommend the scan region for the next scanning process of the marking 240, 250, 260, 270, 280. Moreover, the trained machine learning model 800 can be designed to output a measure of prediction accuracy or a measure of confidence for the next processing interval 930, 950, 970.

In addition, the trained machine learning model 800 can be designed to provide a displacement and/or a distortion of the repair shape 500, 550 at its output layer 720. In another exemplary embodiment of the trained machine learning model 800, the displacement and/or the distortion of the repair shape 500, 550 can be ascertained from the output data supplied by the trained model 800, namely the drift 410, 420, 430, 480 of the marking 240, 250, 260, 270, 280.

As is evident from FIG. 9, the use of a trained machine learning model 800 makes it possible to minimize an error between the predicted drift 410, 420, 430, 480 and the actual displacement 310 of the marking 240, 250, 260, 270, 280. Moreover, the use of the trained machine learning model 800 minimizes the number of scan processes over the marking 240, 250, 260, 270, 280. This has two advantageous effects. Firstly, the degradation of the marking 240, 250, 260, 270, 280 is reduced, which is advantageous for the precision of the determination of the position of the marking. Secondly, the time saved for scanning the marking 240, 250, 260, 270, 280 can be used for repairing the defect 290. The throughput of the defect repair process is increased as a result.

Instead of the prediction of the drift 410, 420, 430, 480 of a marking 240, 250, 260, 270, 280 with the aid of a trained machine learning model 800, a predictive filter can also be used for this purpose. As already explained above, a predictive filter can be embodied for example in the form of a Kalman filter, a particle filter or a low-pass filter with a finite impulse response. A predictive filter uses the data of the last determination of the position 440, 450, 460, 480 of the marking 240, 250, 260, 270, 280 as input data. Furthermore, earlier measurements of the marking 240, 250, 260, 270, 280 can likewise be made available as input data to the predictive filter. Furthermore, it is possible to make available the measure of certainty with respect to the detection of the marking 240, 250, 260, 270, 280 to the predictive filter as input data.

From the input data, the predictive filter predicts a drift or displacement 410, 420, 430, 480 dx(t) and dy(t) for the marking 240, 250, 260, 270, 280 for the next processing interval. Furthermore, predictive filters can be designed to determine an uncertainty of the prediction or a measure of confidence, which can be used for adapting the frequency with which the marking 240, 250, 260, 270, 280 is scanned. Furthermore, the predictive filter can be reset to an initial state if a particularly severe drift 410, 420, 430, 380, 610, 620 was detected and/or should be expected on account of changes in external parameters, for example as a result of the switching of precursor gases and/or as a result of switching between repair shapes 500, 550.

Moreover, possible assumptions or prior knowledge about the movement of the marking(s) 240, 250, 260, 270, 280 as a movement model can influence a predictive filter, for instance by use of the specification of a linear movement model. If no prior knowledge is available, it is possible—as already explained above—for a movement model also to be learned from available data.

Figure 10:
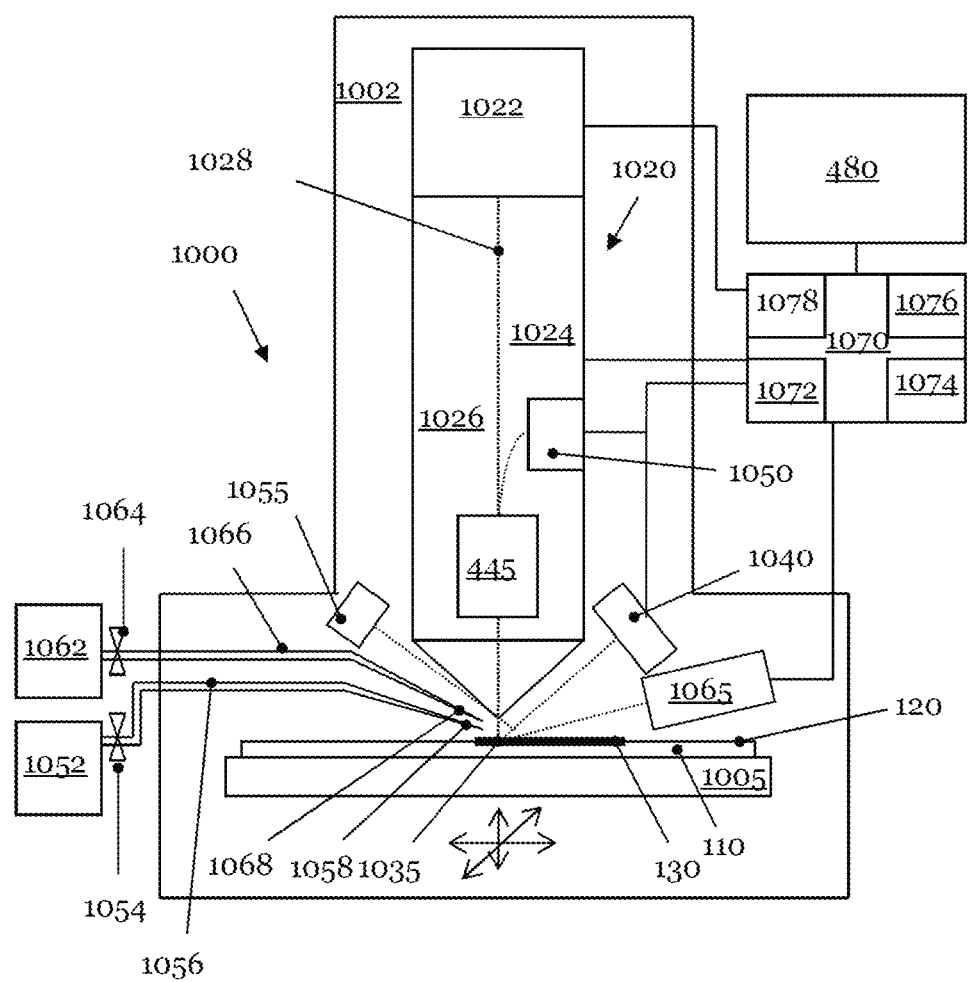
FIG. 10 schematically presents some components of a device for carrying out a method according to the invention.

FIG. 10 schematically shows in section several components of a device 1000 or a measuring device 1000, which has a scanning particle microscope 1020 in a vacuum chamber 1002. In the example in FIG. 10, the scanning particle microscope 1020 is a scanning electron microscope (SEM) 1020, for example the SEM 160 from FIG. 1. An electron beam as a particle beam has the advantage that the sample 110, for instance the mask 200, substantially cannot be damaged, or can be damaged only to a slight extent, by said beam. However, other charged particle beams are also possible, for instance an ion beam of an FIB (Focused Ion Beam) system (not illustrated in FIG. 10).

The SEM 1020 comprises as essential components a particle gun 1022 and a column 1024, in which the electron optical unit or beam optical unit 1026 is arranged. The electron gun 1022 generates an electron beam 1028 and the electron or beam optical unit 1026 focuses the electron beam 1028 and directs the latter to a sample 110 or the mask 200 at the output of the column 1024. The sample 110 or the mask 200 has a surface 120 with a structure or pattern element 130. A surface charge 140, 150 present on the mask 200 is not illustrated in FIG. 10.

The sample 110 or the mask 200 is arranged on a sample stage 1005. As symbolized by the arrows in FIG. 10, the sample stage 1005 can be moved in three spatial directions relative to the electron beam 1028 of the SEM 1020.

A spectrometer-detector combination 1040 discriminates the secondary electrons generated from the electron beam 1028 at the measuring point 1035 and/or electrons backscattered by the sample 110 on the basis of their energy and then converts them into an electrical measurement signal. The measurement signal is then passed on to an evaluation unit 1076 of the computer system 1070.

To separate energy, the spectrometer-detector combination 1040 can contain a filter or a filter system in order to discriminate the electrons in the energy (not illustrated in FIG. 10).

Like the spectrometer-detector combination 1040, energy-resolving spectrometers can be arranged outside the column 1024 of the SEM 1020. However, it is also possible to arrange a spectrometer and the associated detector in the column 1024 of an SEM 1020. In the example illustrated in FIG. 10, a spectrometer 1045 and a detector 1050 are incorporated in the column 1024 of an SEM 1020. In addition or as an alternative to the spectrometer-detector combination 1040, the spectrometer 1045 and the detector 1050 can be used in the device 1000.

Furthermore, the device 1000 in FIG. 10 can optionally comprise a detector 1055 for detecting the photons generated by the incident electron beam 1028 at the measuring point 1035. The detector 1055 can for example spectrally resolve the energy spectrum of the generated photons and thereby allow conclusions to be drawn concerning the composition of the surface 120 or layers near the surface of the sample 110.

In addition, the measuring device 1000 can comprise an ion source 1060, which provides low-energy ions in the region of the measuring point 1035 for the case where the sample 110 or its surface 120 is electrically insulating or semiconducting and has a negative surface charge 150. With the aid of the ion source 1060, a negative charging of the sample surface 120 can be reduced locally and in a controlled manner.

If the sample surface 120 has an undesired distribution of positive surface charges 140, caused for instance by the handling of the sample 110, the electron beam 1028 can be used to reduce the charging of the sample surface 120.

The computer system 1070 comprises a scanning unit 1072, which scans the electron beam 1028 over the sample 110, i.e. for the marking 240, 250, 260, 270, 280 and/or the defect 290. The scanning unit 1072 controls deflection elements in the column 1024 of the SEM 1020, which are not illustrated in FIG. 10. Furthermore, the computer system 1070 comprises a setting unit 1074, in order to set and control the various parameters of the SEM 1020. Parameters that can be set by the setting unit 1074 can be for example: the magnification, the focus of the electron beam 1028, one or more settings of the stigmator, the beam displacement, the position of the electron source and/or one or more stops (not illustrated in FIG. 10).

Moreover, the computer system 1070 comprises a storage unit 1076, in which a machine learning model 700, a trained machine learning model 800 and/or a predictive filter are/is stored. The computer system 1070 can furthermore comprise a processor designed to implement the generic machine learning model 700 for training purposes and the trained machine learning model 800 and also the predictive filter for prediction purposes. The processor can comprise a powerful graphics processor, for example.

The computer system 1070 in FIG. 10 can be integrated into the device 400 or it can be embodied as a dedicated apparatus. The computer system 1070 can be embodied using hardware, software, firmware or a combination.

For processing the defect 290 of the mask 200, the device 1000 in FIG. 10 preferably comprises a plurality of different storage tanks for different process or precursor gases. In the device 1000 given by way of example, two storage tanks are illustrated. However, a device 1000 can also comprise more than two storage tanks for processing a sample 110 or the mask 200. The first storage tank 1052 stores a precursor gas or a deposition gas, which can be used in cooperation with the electron beam 1028 of the SEM 1020 for depositing material for producing a marking 240, 250, 260, 270, 280 of the mask 200. Furthermore, the electron beam 1028 of the SEM 1030 can be used for depositing missing absorbent material of one of the pattern elements 130, 220 and/or 230 of the sample 110 and/or the mask 200. The second storage tank 1062 contains an etching gas that can be used to etch the sample surface 120, a structure element 130, for instance a pattern element 220, 230, and/or the defect 290.

Each storage tank 1052, 1062 is equipped with its own valve 1054 and 1064, respectively, to control the amount of gas particles provided per unit of time or the gas flow rate at the location of incidence 1035 of the electron beam 1028 on the surface 120 of the sample 110. Furthermore, the two storage tanks 1052, 1062 have their own gas feeds 1056, 1066, which end with a nozzle 1058, 1068 near the point of incidence 1035 of the electron beam 1028 on the sample 110. In the device 1000 that is illustrated by way of example in FIG. 10, the valves 1054, 1064 are incorporated in the vicinity of the storage tanks. In an alternative embodiment, the valves 1054, 1064 can be arranged in the vicinity of the corresponding nozzle 1058 and 1068, respectively (not shown in FIG. 10). Each storage tank 1052, 1062 can have its own element for individual temperature setting and control. The temperature setting facilitates both cooling and heating for each precursor gas. In addition, the gas feeds 1056, 1066 can likewise respectively have their own element for setting and monitoring the temperature at which each precursor gas is provided at the reaction location (likewise not shown in FIG. 10).

The device 1000 in FIG. 10 can comprise a pump system to produce and maintain the required vacuum. The pump system is not shown in FIG. 10 for reasons of clarity. In addition, the device 1000 can include a suction extraction device (likewise not illustrated in FIG. 10). The suction extraction device in combination with a pump or a pump system makes it possible that the fragments or constituents that are produced during the decomposition of a precursor gas and are not required for the local chemical reaction can be extracted from the vacuum chamber 1002 of the device 1000 substantially at the point of origin. Since the gas constituents that are not required are pumped away locally at the point of incidence of the electron beam 1028 on the sample 110 out of the vacuum chamber 1002 of the device 1000 before they can be distributed and settle in it, contamination of the vacuum chamber 1002 is prevented.

Figure 11:
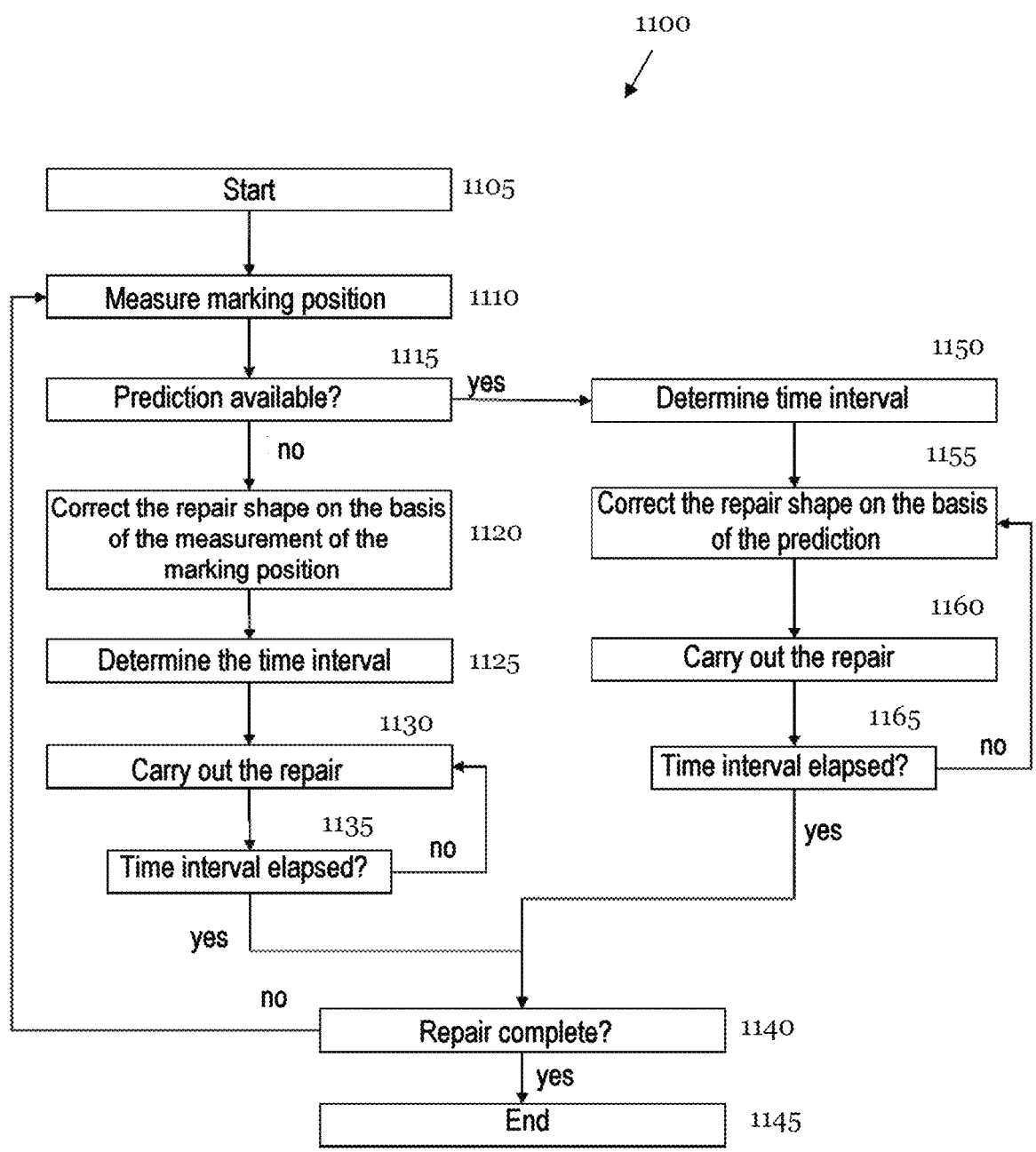
FIG. 11 represents in a flow diagram an embedding of a method according to the invention in a repair process of the defect from FIGS. 2A and 2B.

The flow diagram 1100 in FIG. 11 shows the embedding of a method according to the invention for predicting a drift 410, 420, 430, 480 of a charged particle beam 160, 1028 into a conventional method. The method begins in step 1105. The first step 1110 involves measuring the position of the marking 240, 250, 260, 270, 280. The reference position 330 of the at least one marking 240, 250, 260, 270, 280 is measured at the beginning of the method, for example for correcting the defect 290.

In decision block 1115, a decision is then taken as to whether or not the device 1000 carrying out the repair process of the defect 290 has a prediction possibility, i.e. comprises a trained ML model 800 and/or a predictive filter.

If this is not the case, the correction process explained in the context of FIG. 3 is carried out. Firstly, in step 1120, the repair shape 500 for the defect 290 is adapted on the basis of the measurement of the reference position 330. A time interval 340 for carrying out part of the repair process of the defect 290 is ascertained in step 1125. The repair is then carried out in step 1130. Decision block 1135 involves constantly checking whether or not the time interval 340 determined has elapsed. If this is the case, the method advances to decision block 1140, which involves clarifying whether or not the correction process of the defect 290 has been completed.

If the repair has been completed, the method ends in step 1145. If the repair process has not yet been completed, the method jumps to block 1110, where the position 440, 450, 460, 470 of the marking 240, 250, 260, 270, 280 is measured again. The method then advances to decision block 1115.

If decision block 1115 establishes that a prediction of the drift 410, 420, 430, 480 of the marking 240, 250, 260, 270 is possible, the method is carried out as explained in the context of the discussion of FIG. 9. Step 1150 involves defining a time interval within which a drift 410, 420, 430, 480 of the marking 240, 250, 260, 270, 280 can be reliably predicted. In block 1155, the repair shape 500, 550 is then corrected on the basis of the prediction of the drift 410, 420, 430, 480 of the marking 240, 250, 260, 270, 280. The repair of the defect 290 is then carried out in block 1160. At the same time, in decision block 1165, a check is made to establish whether the time interval defined for the prediction in block 1150 is still ongoing or has elapsed.

If the time defined in the time interval has elapsed, the method advances to decision block 1140. The further progress of the method has already been explained above.

Figure 12:
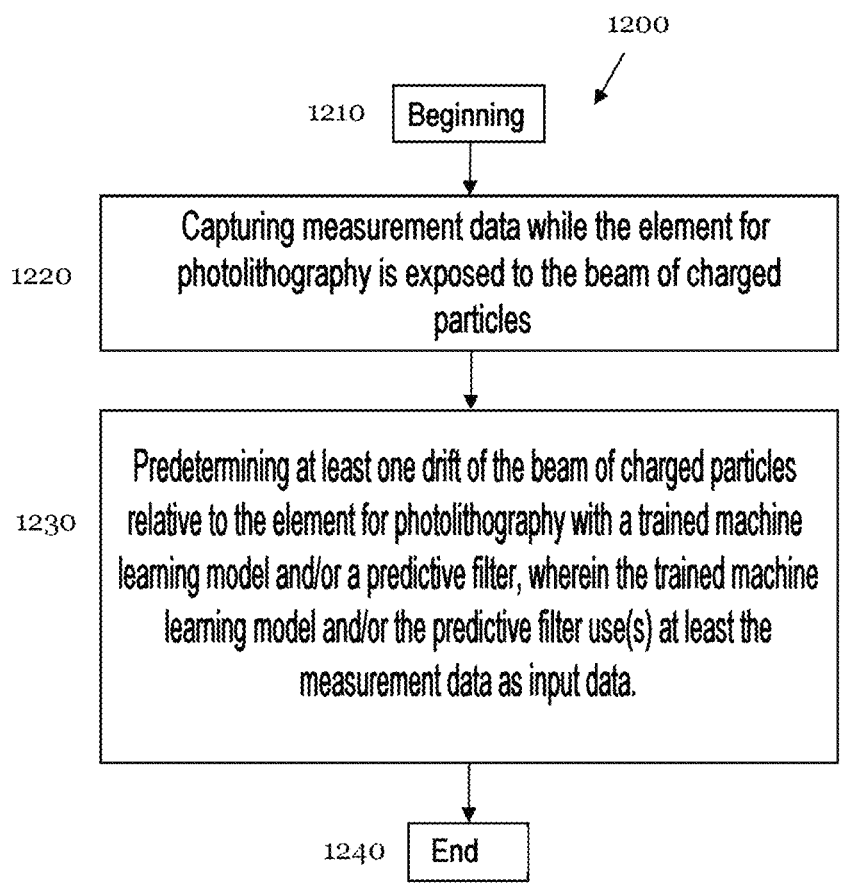
FIG. 12 illustrates a flow diagram of the method according to the invention for examining and/or processing an element for photolithography with a beam of charged particles.

Finally, the flow diagram 1200 in FIG. 12 presents essential steps of a method for examining and/or for processing an element for photolithography with a beam of charged particles 160, 1028. The method begins in step 1210. The first step 1220 involves acquiring measurement data 330, 440, 450, 460, 470 while the element for photolithography 110, 200 is exposed to the beam of charged particles 160, 1028. Block 1230 then involves predetermining at least one drift 410, 420, 430, 480 of the beam of charged particles 160, 1028 relative to the element for photolithography 110, 200 with a trained machine learning model 800 and/or a predictive filter, wherein the machine learning model 800 and/or the predictive filter use(s) at least the measurement data 330, 440, 450, 460, 470 as input data 830. Finally, the method ends in block 1240.

What is claimed is:

1. A device for examining and/or processing an element for photolithography with a beam of charged particles, comprising:
   a. means for acquiring measurement data while the element for photolithography is exposed to the beam of charged particles;
   b. means for predetermining a drift of the beam of charged particles relative to the element for photolithography with a trained machine learning model and/or a predictive filter, wherein the trained machine learning model and/or the predictive filter use(s) at least the measurement data as input data; and
   c. means for correcting at least one defect of the element for photolithography with the beam of charged particles and at least one precursor gas.

2. The device of claim 1, wherein the element for photolithography comprises at least one marking.

3. The device of claim 2, comprising means for determining a reference position of the at least one marking before the beginning of the examination and/or the processing of the element for photolithography by scanning the at least one marking.

4. The device of claim 3, comprising means for determining a position change of the at least one marking with respect to the reference position.

5. The device of claim 3, wherein the scanning particle microscope and the computer system are configured to determine a position change of the at least one marking with respect to the reference position.

6. The device of claim 2, comprising means for determining a measure of certainty with respect to a detection of the at least one marking.

7. The device of claim 2, wherein the at least one additional parameter comprises at least one of: a temperature in the examination and/or processing region, a pressure in the examination and/or processing region, an air humidity in the examination and/or processing region, a type of the element for photolithography, a type of the defect of the element for photolithography, a size of the defect, a location of the defect on the element for photolithography, the location of the defect relative to the at least one marking, at least one precursor gas used for defect correction, a gas mass flow rate of the at least one precursor gas, a time of action of the at least one precursor gas, a time duration of the defect correction, a residence duration of the element for photolithography in the device, one or a plurality of scan operating modes of the beam of charged particles, a residence duration of the beam of charged particles during the examination and/or processing of the element for photolithography, a number of switching processes of the at least one precursor gas during the processing of the element for photolithography, or points in time of the switching processes of the at least one precursor gas during the processing of the element for photolithography.

8. The device of claim 2, wherein the trained machine learning model and/or the predictive filter predetermine(s) continuously over time a displacement of the reference position of the at least one marking.

9. The device of claim 2, wherein the trained machine learning model outputs at least one element from the group: a length of a time interval until a renewed acquisition of measurement data, a measure of confidence of a drift correction and a scan region for a next scan of the at least one marking.

10. The device of claim 2, wherein the predictive filter is configured to couple a time duration until the next scanning of the at least one marking with an uncertainty of the predetermination by the predictive filter.

11. The device of claim 2, comprising means for instigating immediate or delayed scanning of the at least one marking, on the basis of output data of the trained machine learning model and/or of the predictive filter.

12. The device of claim 2, comprising a scanning particle microscope and a computer system configured to control the scanning particle microscope, wherein the scanning particle microscope and the computer system in combination are configured to determine a reference position of the at least one marking before the beginning of the examination and/or the processing of the element for photolithography by scanning the at least one marking.

13. The device of claim 2, comprising a scanning particle microscope and a computer system configured to determine a measure of certainty with respect to a detection of the at least one marking.

14. The device of claim 2, comprising a scanning particle microscope and a computer system configured to instigate immediate or delayed scanning of the at least one marking, on the basis of output data of the trained machine learning model and/or of the predictive filter.

15. The device of claim 1, wherein the trained machine learning model is configured to determine a measure of confidence.

16. The device of claim 15, wherein the trained machine learning model and/or the predictive filter are/is configured to use the measure of confidence as input data.

17. The device of claim 1, wherein the trained machine learning model uses at least one additional parameter of the examination and/or processing as additional input data.

18. The device of claim 1, wherein the trained machine learning model comprises a recurrent neural network.

19. The device of claim 18, wherein the recurrent neural network comprises a long short-term memory, LSTM, network.

20. The device of claim 1, wherein the predictive filter comprises an element from the group: a Kalman filter, a particle filter and a low-pass filter with a finite impulse response.

21. The device of claim 1, wherein the trained machine learning model and/or the predictive filter are/is configured to predetermine distortion parameters of the scan region of the beam of charged particles.

22. A non-volatile computer-readable medium storing a computer program comprising instructions which, when executed by a computer system, cause the device of claim 1 to carry out a method for examining and/or processing the element for photolithography with the beam of charged particles, the method comprising:

acquiring measurement data while the element for photolithography is exposed to the beam of charged particles;

predetermining at least one drift of the beam of charged particles relative to the element for photolithography with a trained machine learning model and/or a predictive filter, wherein the trained machine learning model and/or the predictive filter use(s) at least the measurement data as input data; and correcting at least one defect of the element for photolithography with the beam of charged particles and at least one precursor gas.

23. A method for examining and/or processing an element for photolithography with a beam of charged particles, the method comprising the following steps:

a. acquiring measurement data while the element for photolithography is exposed to the beam of charged particles;

b. predetermining at least one drift of the beam of charged particles relative to the element for photolithography with a trained machine learning model and/or a predictive filter, wherein the trained machine learning model and/or the predictive filter use(s) at least the measurement data as input data; and c. correcting at least one defect of the element for photolithography with the beam of charged particles and at least one precursor gas.

24. The method of claim 23, comprising carrying out the acquiring measurement data, the predetermining at least one drift of the beam of charged particles relative to the element for photolithography, and the correcting at least one defect of the element for photolithography by using a device for examining and/or processing an element for photolithography with a beam of charged particles, the device comprising:

a. means for acquiring measurement data while the element for photolithography is exposed to the beam of charged particles;

b. means for predetermining a drift of the beam of charged particles relative to the element for photolithography with a trained machine learning model and/or a predictive filter, wherein the trained machine learning model and/or the predictive filter use(s) at least the measurement data as input data; and c. means for correcting at least one defect of the element for photolithography with the beam of charged particles and at least one precursor gas.

\* \* \* \* \*